US012787172B2

(12) United States Patent
Genau

(10) Patent No.: US 12,787,172 B2
(45) Date of Patent: Nov. 3, 2026

(54) PRINTED CIRCUIT BOARD ARRANGEMENT

(71) Applicant: HARTING ELECTRONICS GMBH, Espelkamp (DE)

(72) Inventor: Marc Genau, Lübbecke (DE)

(73) Assignee: HARTING ELECTRONICS GMBH, Espelkamp (DE)

( * ) Notice: Subject to any disclaimer, the term of this patent is extended or adjusted under 35 U.S.C. 154(b) by 172 days.

(21) Appl. No.: 18/290,728

(22) PCT Filed: Jul. 8, 2022

(86) PCT No.: PCT/DE2022/100489
§ 371 (c)(1),
(2) Date: Jan. 19, 2024

(87) PCT Pub. No.: WO2023/001329
PCT Pub. Date: Jan. 26, 2023

(65) Prior Publication Data
US 2024/0268028 A1 Aug. 8, 2024

(30) Foreign Application Priority Data
Jul. 23, 2021 (DE) ..................... 10 2021 119 088.6

(51) Int. Cl.
*H05K 1/14* (2006.01)
*H05K 3/32* (2026.01)
*H05K 3/36* (2006.01)

(52) U.S. Cl.
CPC ............... *H05K 1/145* (2013.01); *H05K 3/32* (2013.01); *H05K 3/368* (2013.01);
(Continued)

(58) Field of Classification Search
CPC .......... H05K 1/145; H05K 3/32; H05K 3/368; H05K 2201/042; H05K 2201/10189;
(Continued)

(56) References Cited

U.S. PATENT DOCUMENTS 3,812,381 A * 5/1974 Guyton .................. H01R 12/52
439/55
8,690,586 B2 4/2014 Schneider
(Continued)

FOREIGN PATENT DOCUMENTS

CN 109479382 A 3/2019
CN 111758189 A 10/2020
(Continued)

OTHER PUBLICATIONS

European Patent Office, International Search Report and Written Opinion for International Application No. PCT/DE2022/100489, mailed Nov. 7, 2022, 9 pages (with English translation of International Search Report).
(Continued)

*Primary Examiner* — Allen L Parker
*Assistant Examiner* — Peter Krim
(74) *Attorney, Agent, or Firm* — Seed Intellectual Property Law Group LLP

(57) ABSTRACT

A printed circuit board arrangement is provided having a first printed circuit board with at least two first contact elements fastened thereto and protruding vertically therefrom, a second printed circuit board with at least two second contact elements fastened thereto, protruding vertically therefrom and corresponding to the first contact elements, and a plastics housing which is mounted on the first printed circuit board and in which the first contact elements are held with a form fit and the second contact elements are mounted displaceably.

10 Claims, 2 Drawing Sheets

(52) U.S. Cl.
CPC .................. *H05K 2201/042* (2013.01); *H05K 2201/10189* (2013.01); *H05K 2201/10409* (2013.01); *H05K 2201/10492* (2013.01); *H05K 2201/105* (2013.01); *H05K 2203/167* (2013.01)

(58) Field of Classification Search
CPC .......... H05K 2201/10492; H05K 2201/10409; H05K 2201/105; H05K 2203/167; H01R 12/732; H01R 12/727; H01R 12/724; H01R 12/7011; H01R 12/7047; H01R 12/721; H01R 13/512; H01R 13/514; H01R 13/506; H01R 13/508
See application file for complete search history.

(56) References Cited

U.S. PATENT DOCUMENTS

| | | | | |
|---|---|---|---|---|
| 9,039,433 | B2 | 5/2015 | Barthelmes et al. | |
| 9,219,325 | B2 | 12/2015 | Endo et al. | |
| 11,056,807 | B2 | 7/2021 | Hoyack et al. | |
| 11,316,290 | B2 | 4/2022 | Kliever | |
| 11,901,654 | B2 | 2/2024 | Hoyack et al. | |
| 2003/0232541 | A1* | 12/2003 | Meister | H01R 12/52 439/638 |
| 2009/0120668 | A1* | 5/2009 | Fjelstad | H05K 3/222 174/250 |
| 2010/0081309 | A1 | 4/2010 | Voli et al. | |
| 2011/0104911 | A1 | 5/2011 | Sypolt et al. | |
| 2012/0178313 | A1* | 7/2012 | Asano | H01R 4/30 439/778 |
| 2014/0087592 | A1* | 3/2014 | Endo | H01R 12/91 439/628 |
| 2015/0289375 | A1* | 10/2015 | Ozaki | H05K 1/181 336/107 |
| 2015/0325963 | A1 | 11/2015 | Chen | |
| 2016/0353573 | A1* | 12/2016 | Chen | H05K 3/368 |
| 2018/0301830 | A1 | 10/2018 | Hoyack et al. | |
| 2020/0329562 | A1* | 10/2020 | Hsieh | H05K 1/144 |
| 2020/0395695 | A1 | 12/2020 | Benzin | |
| 2021/0203095 | A1 | 7/2021 | Kliever | |
| 2021/0289651 | A1 | 9/2021 | Klanke et al. | |
| 2022/0328988 | A1 | 10/2022 | Wang et al. | |

FOREIGN PATENT DOCUMENTS

| | | | |
|---|---|---|---|
| CN | 112954893 | A | 6/2021 |
| DE | 10206106 | A1 | 11/2002 |
| DE | 102017120357 | A1 | 3/2019 |
| DE | 102018105784 | A1 | 9/2019 |
| DE | 112012002122 | B4 | 11/2020 |
| DE | 102020211008 | A1 | 3/2021 |
| EP | 3399597 | A2 | 11/2018 |
| EP | 3794684 | A1 | 3/2021 |
| WO | WO 2020167603 | A1 | 8/2020 |
| WO | WO 2021013297 | A1 | 1/2021 |

OTHER PUBLICATIONS

German Patent Office, Office Action for German application No. 10 2021 119 088.6 dated Mar. 11, 2022, 5 pages.
International Preliminary Report on Patentability, dated Jan. 18, 2024, for International Patent Application No. PCT/DE2022/100489. (6 pages).

* cited by examiner

PRINTED CIRCUIT BOARD ARRANGEMENT

BACKGROUND

Technical Field

The present disclosure relates to a printed circuit board arrangement.

Such printed circuit board arrangements are often installed in housings of electrical appliances, control units, or similar systems.

Description of the Related Art

The abovementioned housings are subject to high vibrations, in particular in an industrial context, as a result of which the plug connections of the printed circuit boards implemented can be harmed and can fail.

The document EP 3 794 684 A1 shows a printed circuit board contact element, the plugging of which into the printed circuit board for contacting has a certain degree of play, as a result of which certain vibration loads can be compensated. Two printed circuit boards with a cable can be contacted with each other by such a contact element. Care should be taken here that the cable is routed suitably.

The document WO 2021/013297 A1 shows a printed circuit board contact element for contacting two printed circuit boards. The contact element is rigidly fastened on a first printed circuit board with the connection end. It penetrates a contact opening of a second printed circuit board with the other end. The second end is clamped in this contact opening by a special geometry. Vibration play is produced as a result. However, the electrical contact between the contact element and the contact opening becomes worn over time in the case of a continuous vibration load.

A search by the German Patent and Trademark Office has found the following prior art in the priority application for the present application:

DE 102 06 106 A1, DE 10 2017 120 357 A1, WO 2020/167603 A1, EP 3 794 684 A1, and WO 2021/013297 A1.

BRIEF SUMMARY

Embodiments of the disclosure provide a reliable printed circuit board arrangement.

The printed circuit board arrangement described herein includes a first printed circuit board. At least two perpendicularly protruding first contact elements are fastened on the printed circuit board. In some embodiments, the fastening may be affected at contact openings which are surrounded by a conductive material which is in turn connected to at least one trace of the printed circuit board.

The printed circuit board arrangement may include a second printed circuit board. The first and second printed circuit board may be arranged and oriented parallel to each other. At least two second contact elements protruding perpendicularly from the printed circuit board are fastened on the second printed circuit board, preferably at contact openings provided therefor.

The contact elements are a constituent part of the printed circuit board arrangement. The contact elements of the two printed circuit boards correspond to each other. This means that the first contact elements are plugged to each other with the second contact elements associated therewith. The first contact elements may be socket contacts and the second contact elements pin contacts. The pin and socket of the contact elements are here configured in such a way that the pin has a good electrical contact with the socket when plugged into the socket to different depths.

The printed circuit board arrangement may include a plastic housing. The plastic housing is assembled on the first printed circuit board. The first contact elements are retained in form-fitting fashion in the plastic housing. This means that the first contact elements have no or only very little freedom to move inside the plastic housing. The second contact elements are mounted displaceably in the plastic housing. The direction of displacement of the second contact elements is perpendicular to the second printed circuit board. Considered geometrically, this means that the direction of displacement of the second contact elements in the plastic housing is oriented parallel to the normal vector of the printed circuit board plane of the second printed circuit board.

The first and/or the second contact elements may be in each case fastened on the printed circuit board associated therewith via a screw connection. Such a screw connection has proved to be simple to implement and reliable.

The first contact elements may be fastened on the first printed circuit board via a U-shaped screw plate with a threaded opening and a screw which fits the latter. The U-shaped screw plate is here arranged spatially between the printed circuit boards and assembled rigidly on the first printed circuit board and anchored therein. In this case, the screw plate has an electrical contact with the contact openings and/or a trace of the printed circuit board.

The first printed circuit board may have openings for mounting the plastic housing. The plastic housing has cylindrical prongs which are correlated with the openings. The prongs can be plugged into the opening associated therewith in each case and can be clamped therein. The plastic housing is fastened on the first printed circuit board as a result.

The second contact elements may be mounted in the plastic housing so that they cannot twist. A uniform pin/socket movement is ensured as a result.

The second contact elements, i.e., the pin contact elements, are retained in the plastic housing so that they cannot twist and cannot be detached, and can move up and down (direction of movement perpendicular to the printed circuit boards).

If the printed circuit board arrangement as a whole is considered, the first and the second printed circuit board are arranged so that they can move relative to each other by the technical means explained above. The second printed circuit board thus moves in parallel with the first printed circuit board or away from the latter.

The vibrational safety of the system is improved as a result. In addition to the vibrational safety, the "mounting tolerances" of the printed circuit boards relative to each other can also be compensated by the movement of the contact elements. As a result, mechanical stresses in the printed circuit boards are avoided.

BRIEF DESCRIPTION OF THE SEVERAL VIEWS OF THE DRAWINGS

An embodiment of the disclosure is shown in the drawings and will be explained in more detail below.

DETAILED DESCRIPTION

The figures may contain in some cases simplified, schematic illustrations. Identical reference signs are sometimes used for the same but possibly non-identical elements. Different views of the same elements might be at different scales.

Figure 1:
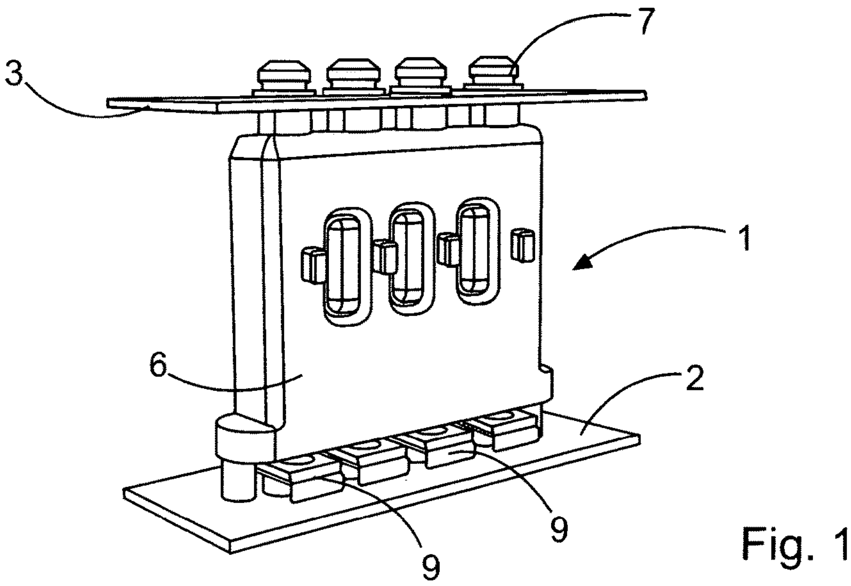
FIG. 1 shows a perspective view of a printed circuit board arrangement according to an embodiment of the invention.

FIG. 1 shows an embodiment of a printed circuit board arrangement 1. The printed circuit board arrangement 1 has a first printed circuit board 2. First contact elements 4 are fastened on or to the first printed circuit board 2 or electrically contacted thereto. The first contact elements 4 protrude perpendicularly from the first printed circuit board 2 in the direction of a second printed circuit board 3. The second printed circuit board 3 is also a constituent part of the printed circuit board arrangement 1. Second contact elements 5, protruding perpendicularly from the second printed circuit board 3, are fastened on or to the latter or electrically contacted thereto. The contact elements 4, 5 are arranged in a plastic housing 6 and are therefore not visible in FIG. 1. The plastic housing 6 is assembled on the first printed circuit board 2.

The first printed circuit board 2 and the second printed circuit board 3 are oriented parallel to each other. Such an arrangement can be found, for example, in electrical appliances, wherein the first printed circuit board 2 is arranged on a first appliance inner wall and the second printed circuit board 3 is arranged on a second housing inner wall situated opposite. The printed circuit boards 2, 3 can then be contacted from outside via a plug connector via corresponding appliance sockets on the appliance walls.

Figure 2:
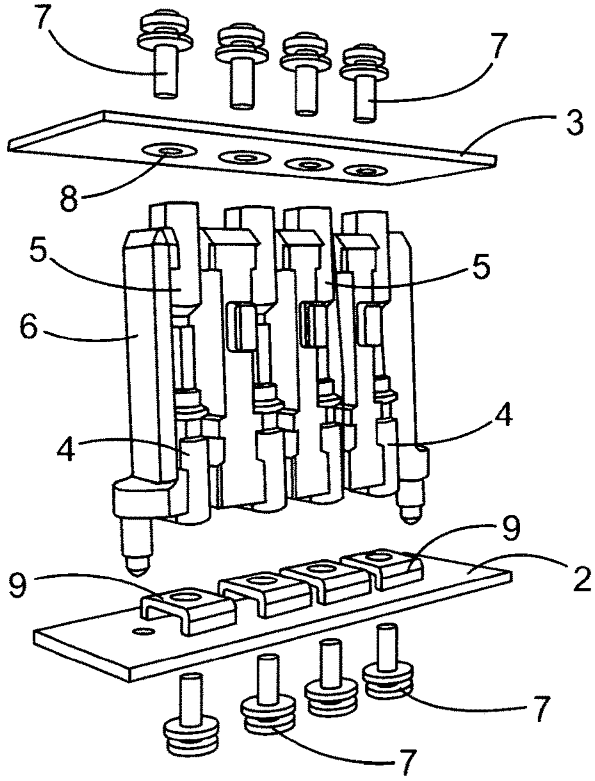
FIG. 2 shows an exploded view of the printed circuit board arrangement.

The first contact elements 4 are configured as socket contacts and the second contact elements 5 as pin contacts. It can be seen in FIG. 2 that the first and second contact elements 4, 5 correlate with each other or are plugged to each other.

The contact elements 4, 5 are contacted via a screw connection in each case at contact openings 8 which consist of an essentially circular through opening with an electrically conductive edge region. The printed circuit boards 2 and 3 form an inner region in which the contact elements 4 and 5 are situated. Screws 7 are inserted from outside into the contact openings 8 in order to contact the contact elements 4 and 5. The contact elements 4, 5 then protrude perpendicularly from the inside of the respective printed circuit board 2, 3. The inside means the space between the two printed circuit boards 2, 3.

U-shaped screw plates 9 with a threaded opening are assembled and fastened on the first printed circuit board 2 via the respective contact openings. The first contact elements 4 are fastened to the first printed circuit board 2 herewith.

Figure 3:
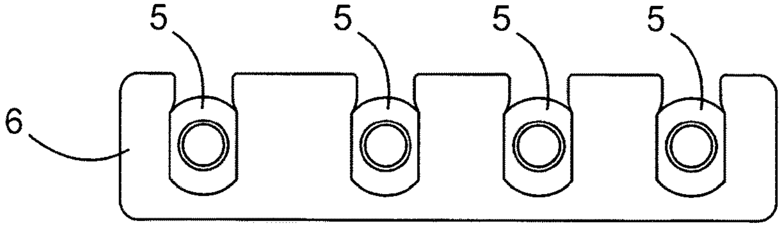
FIG. 3 shows a plan view in section of a plastic housing of the printed circuit board arrangement.

A plan view in section of the plastic housing 6 can be seen in FIG. 3. The line of sight to the first printed circuit board 3 is here oriented from above but is not illustrated in FIG. 3. It can be seen that the second contact elements 5 are arranged in the plastic housing 6 so that they cannot twist. The second contact elements 5 can be moved up and down inside the plastic housing 6 but perpendicularly to the plane of the paper or image.

Figure 5:
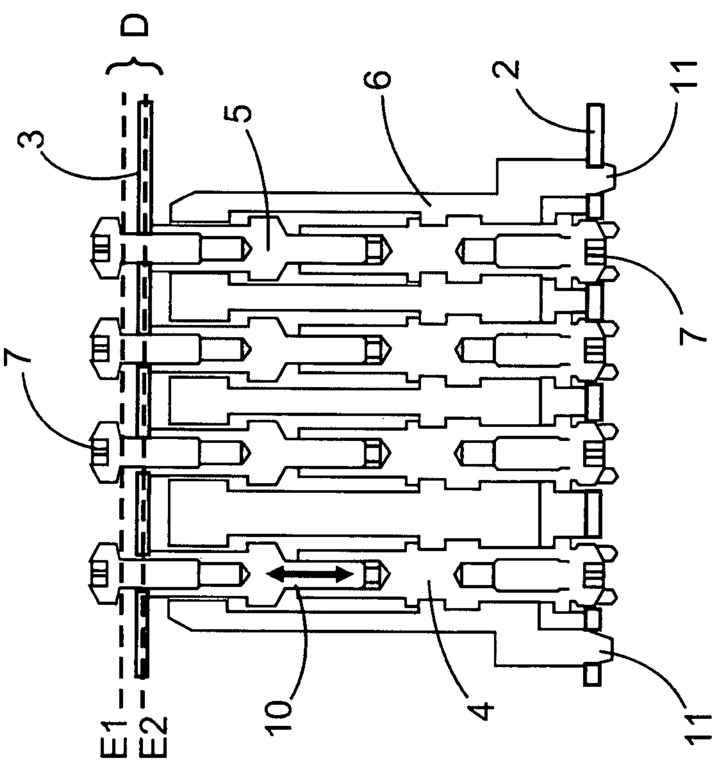
FIG. 5 shows a side view in section of the printed circuit board arrangement in a second play situation.
Figure 4:
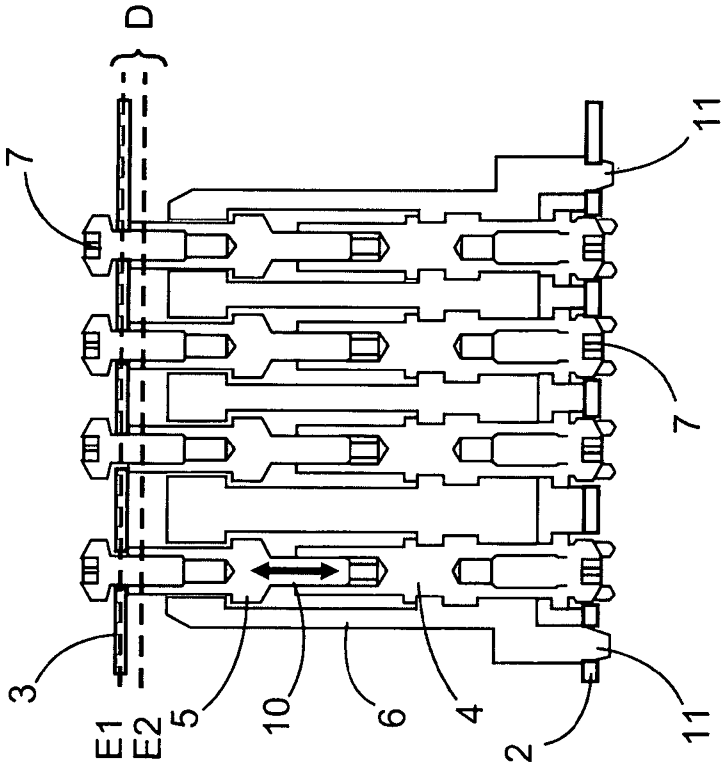
FIG. 4 shows a side view in section of the printed circuit board arrangement in a first play situation.

The printed circuit board arrangement 1 is illustrated in FIGS. 4 and 5 in cross-section in a side view. The plastic housing 6 is fastened on the first printed circuit board 2 via prongs 11. It can be seen that the second contact elements 5 can move in the plastic housing 6 in the direction of the double-headed arrow 10. The pin/socket connection affords sufficient play for this without the electrical contacting between the contact elements 4, 5 being interrupted. As a result, the second printed circuit board 3 can move relative to the first printed circuit board 2 in the direction of the double-headed arrow 10. The play required for this is just a few millimeters but is of vital importance in vibration-loaded applications for the durability of the whole system.

The most spaced-apart position between the first printed circuit board 2 and the second printed circuit board 3 is illustrated in FIG. 4. In contrast, FIG. 5 shows the closest position between the printed circuit boards 2, 3. The different position planes E1, E2 of the second printed circuit board 3 are indicated here. The height difference of these planes is labeled in the Figures with a capital "D". The height difference D can also be referred to as play or freedom to move.

Even though various aspects or features of the disclosure are each shown in combination in the Figures, it is apparent to a person skilled in the art—unless otherwise indicated—that the combinations illustrated and discussed are not the only possible ones. In particular, corresponding units or feature combinations from different embodiments can be interchanged with one another.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A printed circuit board arrangement comprising:

a first printed circuit board with at least two first contact elements fastened thereon and protruding perpendicularly therefrom;

a second printed circuit board with at least two second contact elements fastened thereon, protruding perpendicularly therefrom, and corresponding to the first contact elements and directly engaging the first contact elements in a plug-in direction to establish electrical contact between the first and second contact elements; and a plastic housing which is fixedly secured to the first printed circuit board and spaced apart from the second printed circuit board, and in which the first contact elements are fixedly retained and the second contact elements are mounted displaceably to enable the second contact elements to be displaced within the plastic housing relative to the first contact elements and to enable the second printed circuit board to be displaced relative to the first printed circuit board and to the plastic housing without compromising electrical contact between the first and second contact elements, and wherein the second contact elements are captively retained within the plastic housing by an end portion of the plastic housing opposite the first printed circuit board such that the second contact elements are prevented by the end portion of the plastic housing from being withdrawn from the plastic housing in a direction parallel to the plug-in direction.

2. The printed circuit board arrangement as claimed in claim 1, wherein the first and the second printed circuit board are arranged parallel to each other.

3. The printed circuit board arrangement as claimed in claim 1, wherein the direction of displacement of the second contact elements in the plastic housing is oriented parallel to a normal vector of a printed circuit board plane of the second printed circuit board.

4. The printed circuit board arrangement as claimed in claim 1, wherein each of the first and second contact elements are fastened in each case on or in the region of a respective contact opening of the first printed circuit board and the second printed circuit board respectively.

5. The printed circuit board arrangement as claimed in claim 4, wherein each contact opening is formed from a circular or near circular through opening with an edge region, wherein the edge region includes electrically conductive material or is made from electrically conductive material.

6. The printed circuit board arrangement as claimed in claim 1, wherein each of the first and the second contact elements are in each case fastened on the first printed circuit board and the second printed circuit board respectively via a respective screw connection.

7. The printed circuit board arrangement as claimed in claim 6, wherein each of the first contact elements are fastened on the first printed circuit board via a respective U-shaped screw plate with a threaded opening and a respective screw which fits the threaded opening of the U-shaped screw plate.

8. The printed circuit board arrangement as claimed in claim 1, wherein the first contact elements are socket contacts, and the second contact elements are pin contacts.

9. The printed circuit board arrangement as claimed in claim 1, wherein the first printed circuit board has openings and the plastic housing has cylindrical prongs correlating thereto which are in each case plugged into the opening associated therewith, as a result of which the plastic housing is fastened on the first printed circuit board.

10. The printed circuit board arrangement as claimed in claim 1, wherein the second contact elements are mounted in the plastic housing so that the second contact elements cannot twist.

* * * * *